(12) United States Patent
Zang et al.

(10) Patent No.: US 10,192,786 B2
(45) Date of Patent: Jan. 29, 2019

(54) PROCESS FOR VARIABLE FIN PITCH AND CRITICAL DIMENSION

(71) Applicant: GLOBALFOUNDRIES INC., Grand Cayman (KY)

(72) Inventors: Hui Zang, Guilderland, NY (US); Jinping Liu, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 36 days.

(21) Appl. No.: 15/590,195

(22) Filed: May 9, 2017

(65) Prior Publication Data

US 2018/0330994 A1    Nov. 15, 2018

(51) Int. Cl.
| | |
|---|---|
| *H01L 21/8234* | (2006.01) |
| *H01L 29/417* | (2006.01) |
| *H01L 21/02* | (2006.01) |
| *H01L 27/088* | (2006.01) |

(52) U.S. Cl.
CPC ........ *H01L 21/823431* (2013.01); *H01L 29/41791* (2013.01); *H01L 21/0217* (2013.01); *H01L 21/02348* (2013.01); *H01L 27/0886* (2013.01)

(58) Field of Classification Search
CPC ............ H01L 21/823431; H01L 29/41791
See application file for complete search history.

(56) References Cited

U.S. PATENT DOCUMENTS

| | | | | |
|---|---|---|---|---|
| 9,236,481 B1 * | 1/2016 | Zang | ........... | H01L 29/7851 |
| 9,755,073 B1 * | 9/2017 | Cheng | ........... | H01L 29/7843 |

* cited by examiner

*Primary Examiner* — William F Kraig
*Assistant Examiner* — Vicki B Booker
(74) *Attorney, Agent, or Firm* — Francois Pagette; Hoffman Warnick LLC

(57) ABSTRACT

A multi-masking process is used to form semiconductor fin arrays having a controlled and variable fin pitch and fin critical dimension within different arrays. A layer of curable silicon nitride is incorporated into a patterning architecture, patterned to form an etch mask, and locally cured to further modify the etch mask geometry. The use of cured and uncured structures facilitate the tuning of the resultant fin geometry.

15 Claims, 14 Drawing Sheets

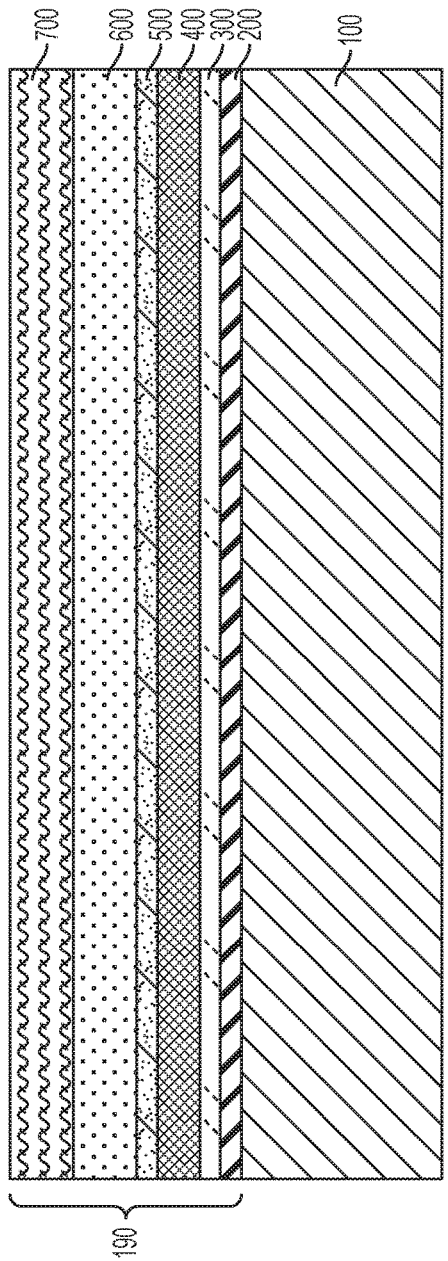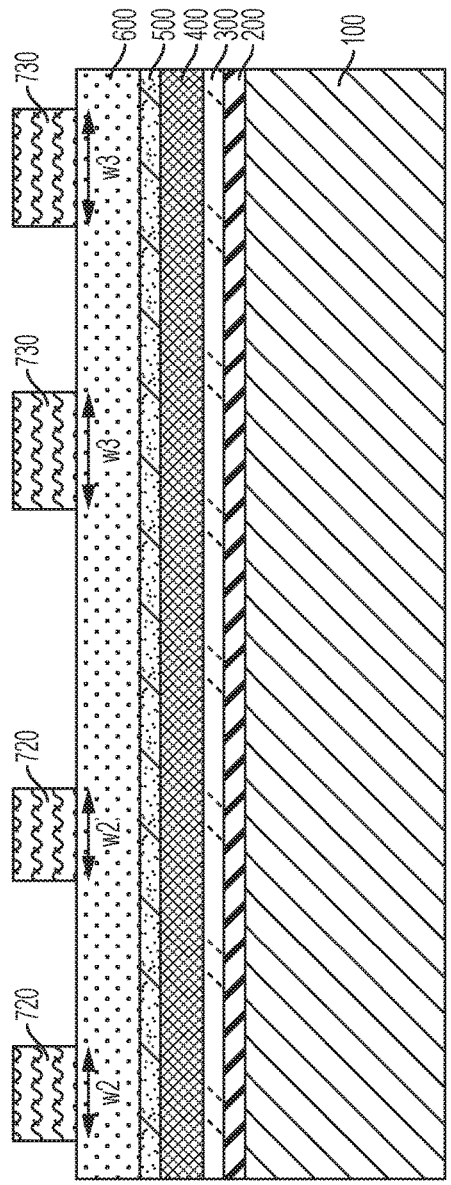

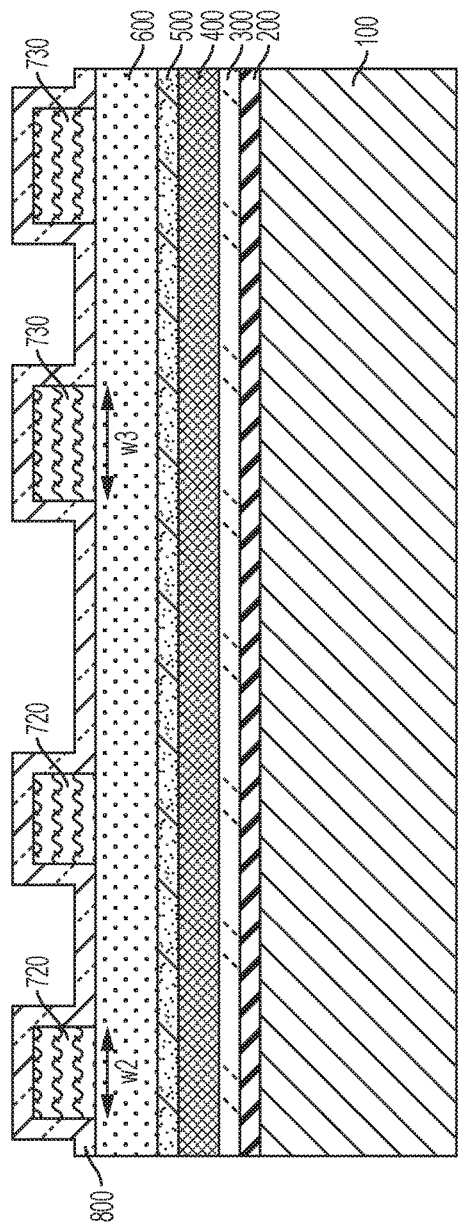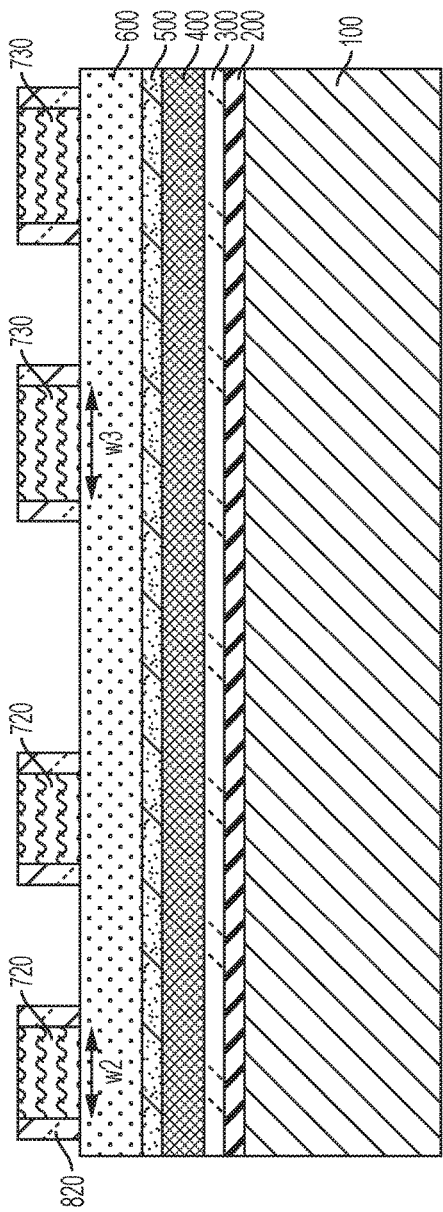

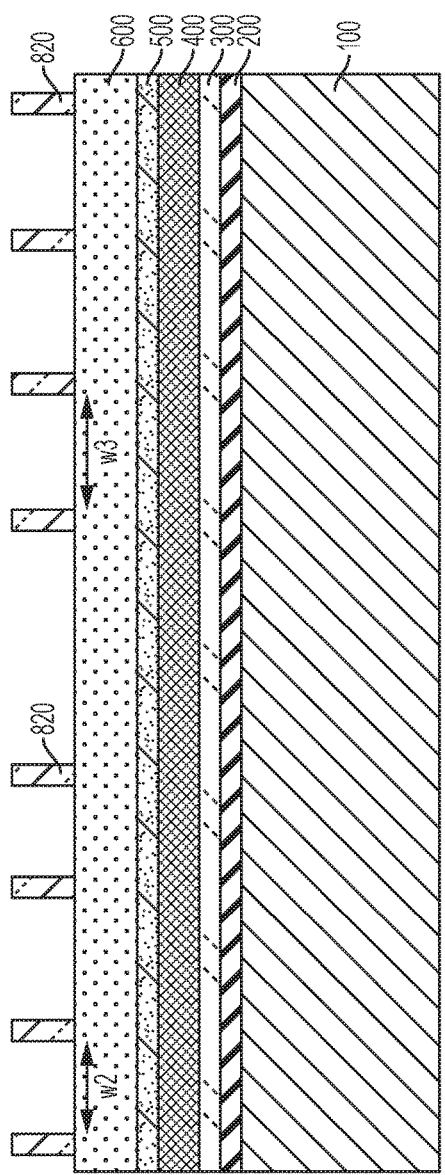
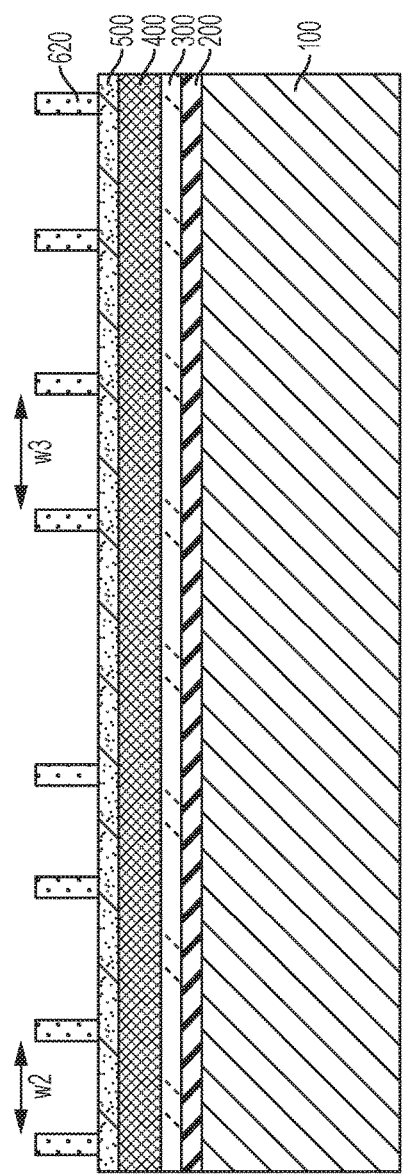

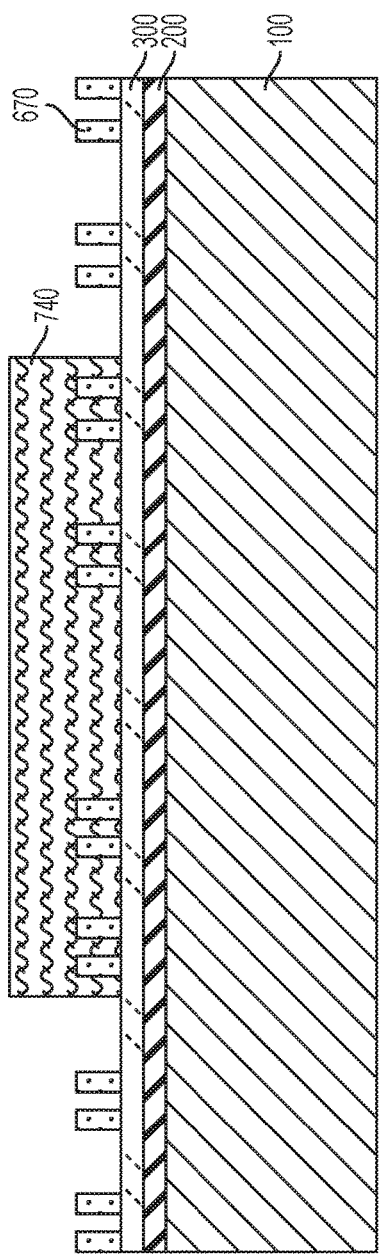
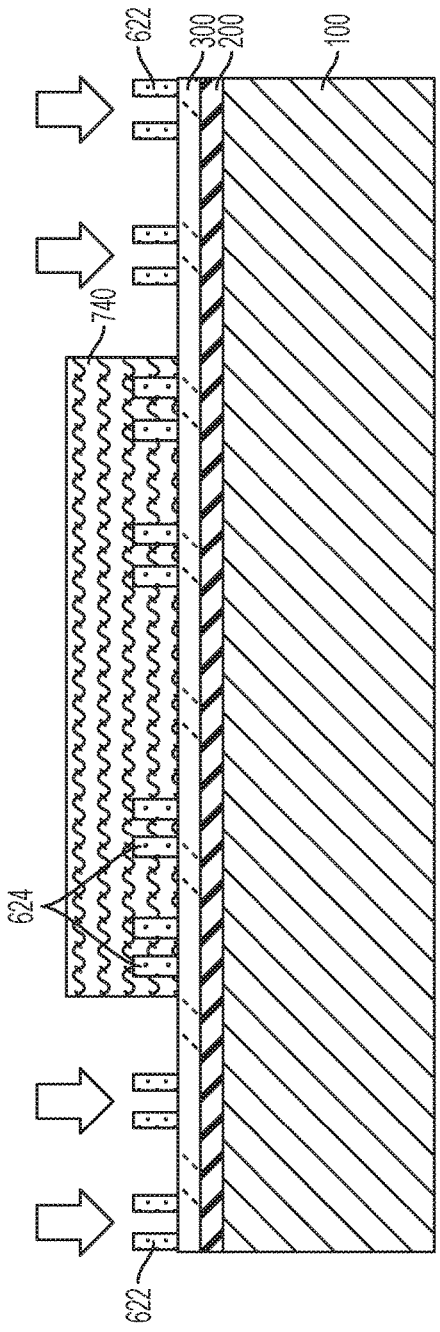

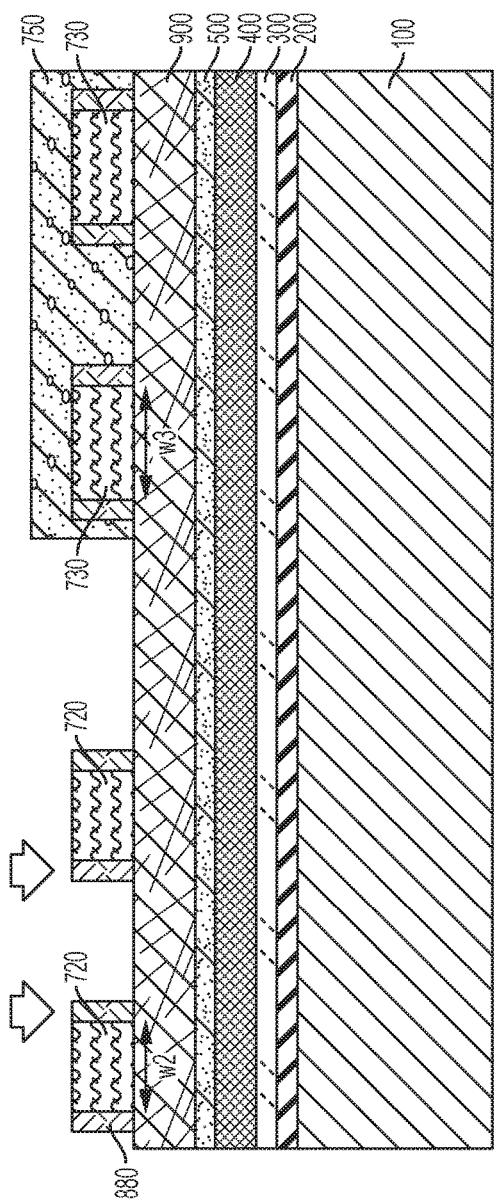
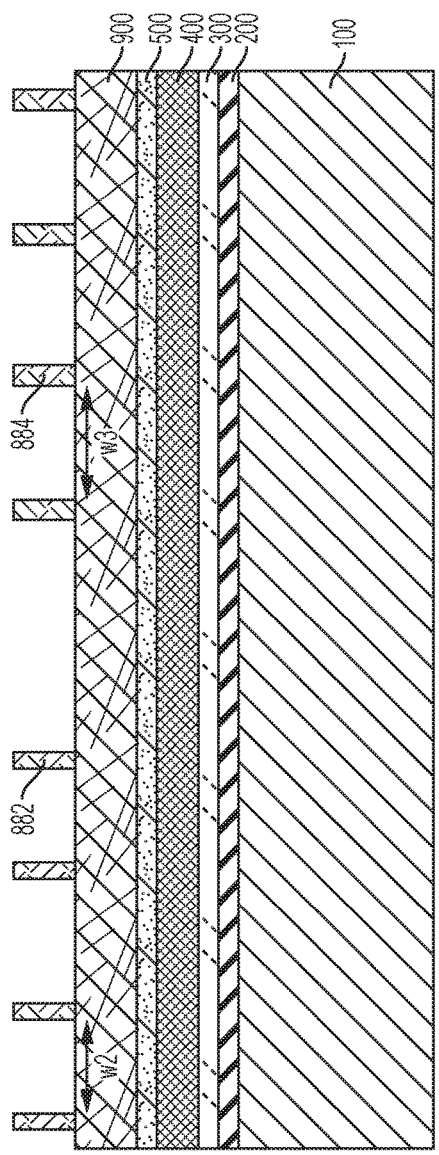
FIG. 19
FIG. 20

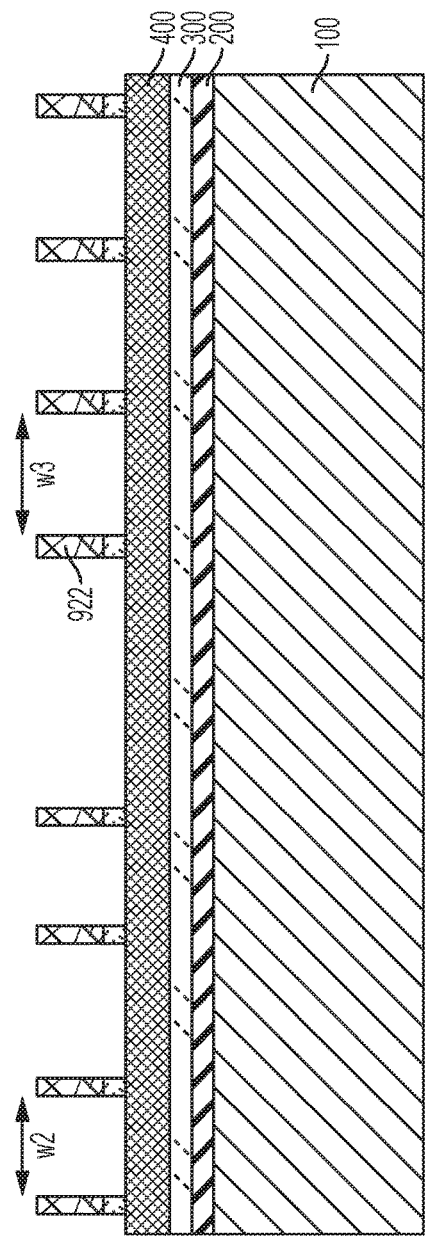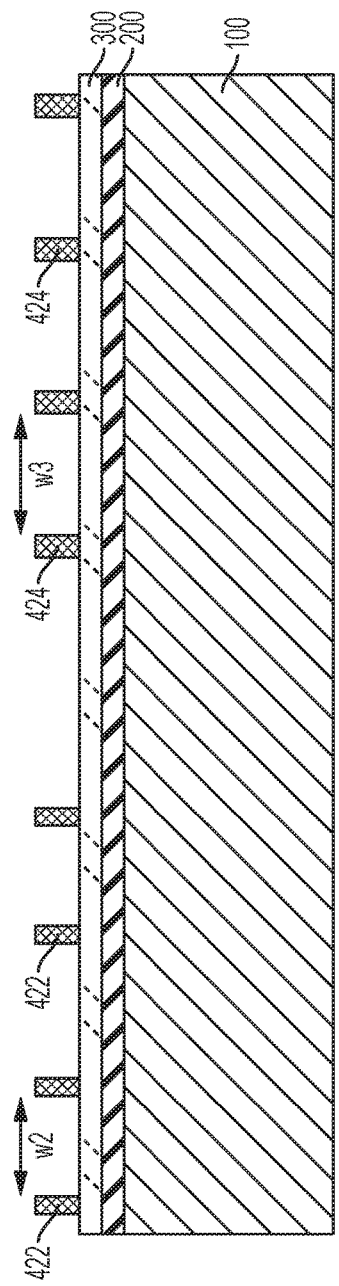

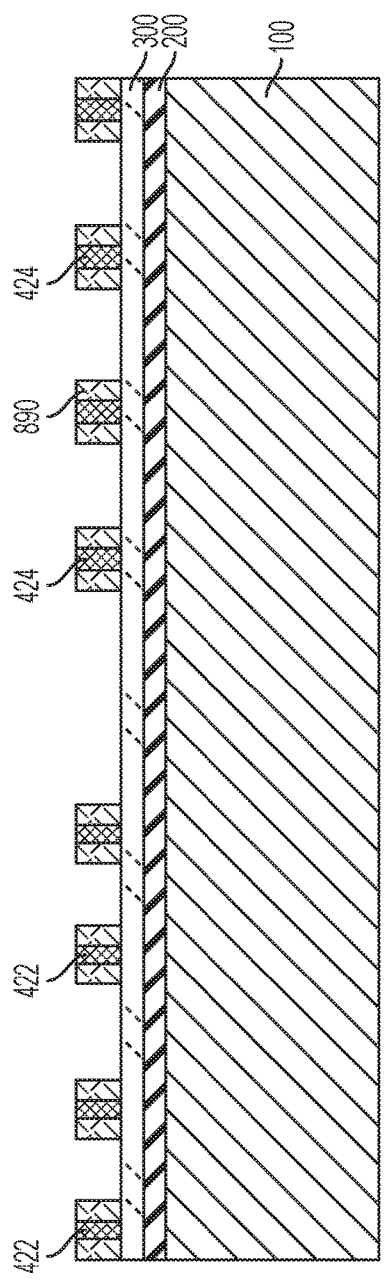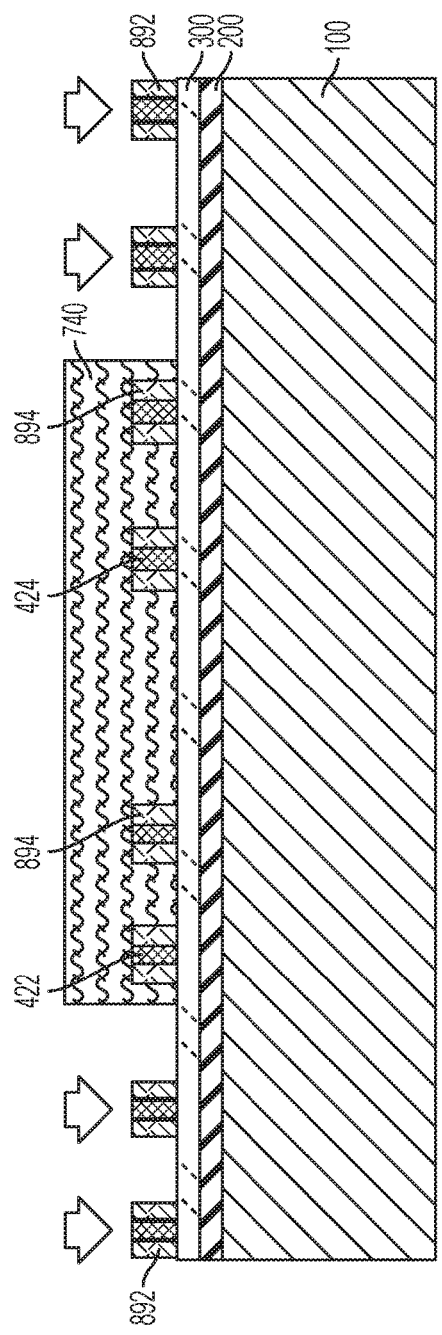

PROCESS FOR VARIABLE FIN PITCH AND CRITICAL DIMENSION

BACKGROUND

The present application relates generally to semiconductor devices, and more particularly to fin field effect transistors (FinFETs) and their methods of fabrication.

Fully-depleted devices such as fin field effect transistors (FinFETs) are candidates to enable scaling of next generation gate lengths to 14 nm and below. Fin field effect transistors (FinFETs) present a three-dimensional architecture where the transistor channel is raised above the surface of a semiconductor substrate, rather than locating the channel at or just below the surface. With a raised channel, the gate can be wrapped around the sides of the channel, which provides improved electrostatic control of the device.

The manufacture of FinFETs typically leverages a self-aligned process to produce extremely thin fins, e.g., 20 nm wide or less, on the surface of a substrate using selective-etching techniques. A gate structure is then deposited to contact multiple surfaces of each fin to form a multi-gate architecture.

FinFETs can be incorporated into a variety of devices, including logic and memory platforms. In devices comprising different functionalities on the same chip, however, it may be desirable to form arrays of fins having distinct fin dimensions and/or intra-fin spacing. One approach for defining plural fins having variable spacing, or pitch, is to cut selected fins from an initial array of fins. However, as will be appreciated, the achievable fin-to-fin spacing with such an approach is limited.

Defining a variable and controllable fin width and pitch between fins in situ has been problematic due to an inadequate lithography processing window resulting in, for example, line-width variability and/or line roughness.

SUMMARY

Disclosed is a multi-patterning process for defining distinct fin arrays having a locally-defined fin pitch and/or fin critical dimension (CD). According to various embodiments, the fin pitch and fin CD within a given array can be independently controlled. Such fin arrays can be configured for disparate functionalities such as logic and/or memory applications. In certain embodiments, control of the fin geometry may be used to facilitate or discourage the merger of raised source/drain junctions between adjacent fins.

As disclosed in further detail herein, fins within first and second regions of a semiconductor substrate can be defined by a sidewall image transfer (SIT) technique using structured etch masks formed from a curable silicon nitride material. A curing process and the attendant volume reduction can be used to tune the dimensions of silicon nitride structures, which allows precise dimensional control of the resulting fins. For instance, a first set of fins can be defined using a first patterning scheme in conjunction with cured etch masks, while a second set of fins can be defined on the same substrate using a second patterning scheme in conjunction with uncured etch masks.

In accordance with embodiments of the present application, a method of forming a semiconductor structure includes forming a curable silicon nitride layer over a semiconductor substrate and patterning the curable silicon nitride layer. A portion of the silicon nitride layer is cured to form a first pattern over a first region of the substrate, while an uncured portion of the patterned silicon nitride layer defines a second pattern over a second region of the substrate. A plurality of semiconductor fins are formed within the first and second regions of the substrate by transferring the first pattern into the first region of the substrate and transferring the second pattern into the second region of the substrate.

A method of forming a semiconductor structure according to further embodiments includes forming a curable silicon nitride layer over a semiconductor substrate, and forming a top mandrel layer over the curable silicon nitride layer. The top mandrel layer is etched to form a first mandrel within a first region of the substrate and a second mandrel within a second region of the substrate. Spacers layers are formed on sidewalls of the first and second mandrels, and a pattern corresponding to the spacer layers is transferred into the curable silicon nitride layer. The method continues by curing a portion of the patterned silicon nitride layer to form a first pattern over the first region of the substrate, wherein an uncured portion of the patterned silicon nitride layer defines a second pattern over the second region of the substrate.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which:

FIG. 2 is a cross-sectional schematic diagram showing a patterning architecture including a curable silicon nitride layer disposed over the semiconductor substrate;

FIG. 3 shows the patterning of an amorphous carbon layer to define a first set of mandrels within first and second device regions of the substrate and a second set of mandrels within third and fourth device regions of the substrate;

FIG. 4 shows the deposition of a conformal spacer layer over the first and second sets of mandrels;

FIG. 5 depicts the anisotropic etch back of the spacer layer;

FIG. 6 shows selective removal of the mandrels to form a patterned spacer layer over the substrate;

FIG. 7 shows an etching step and the transfer of the spacer layer pattern into the curable silicon nitride layer using the spacer layer as an etch mask;

FIG. 12 depicts the formation of a block mask over the curable silicon nitride layer of FIG. 11 within second and third regions of the substrate;

FIG. 13 depicts curing of the silicon nitride layer within first and fourth regions of the substrate;

FIG. 19 depicts the formation of a block mask over the patterned silicon nitride layer and the second set of mandrels within third and fourth regions of the substrate and the curing of the patterned silicon nitride layer within first and second regions of the substrate;

FIG. 20 shows the architecture of FIG. 19 following removal of the block mask;

FIG. 21 shows an etching step to transfer the pattern of the cured and uncured silicon nitride layers into a hard mask;

FIG. 22 shows a further etching step to transfer the pattern of the hard mask into an oxide layer to form oxide mandrels over the substrate;

FIG. 23 shows the deposition of a conformal curable silicon nitride layer over the oxide mandrels following the anisotropic etch back of the curable silicon nitride layer;

FIG. 24 depicts the formation of a block mask over the patterned silicon nitride layer within second and third regions of the substrate and curing of the patterned silicon nitride layer within first and fourth regions of the substrate.

DETAILED DESCRIPTION

Figure 1:
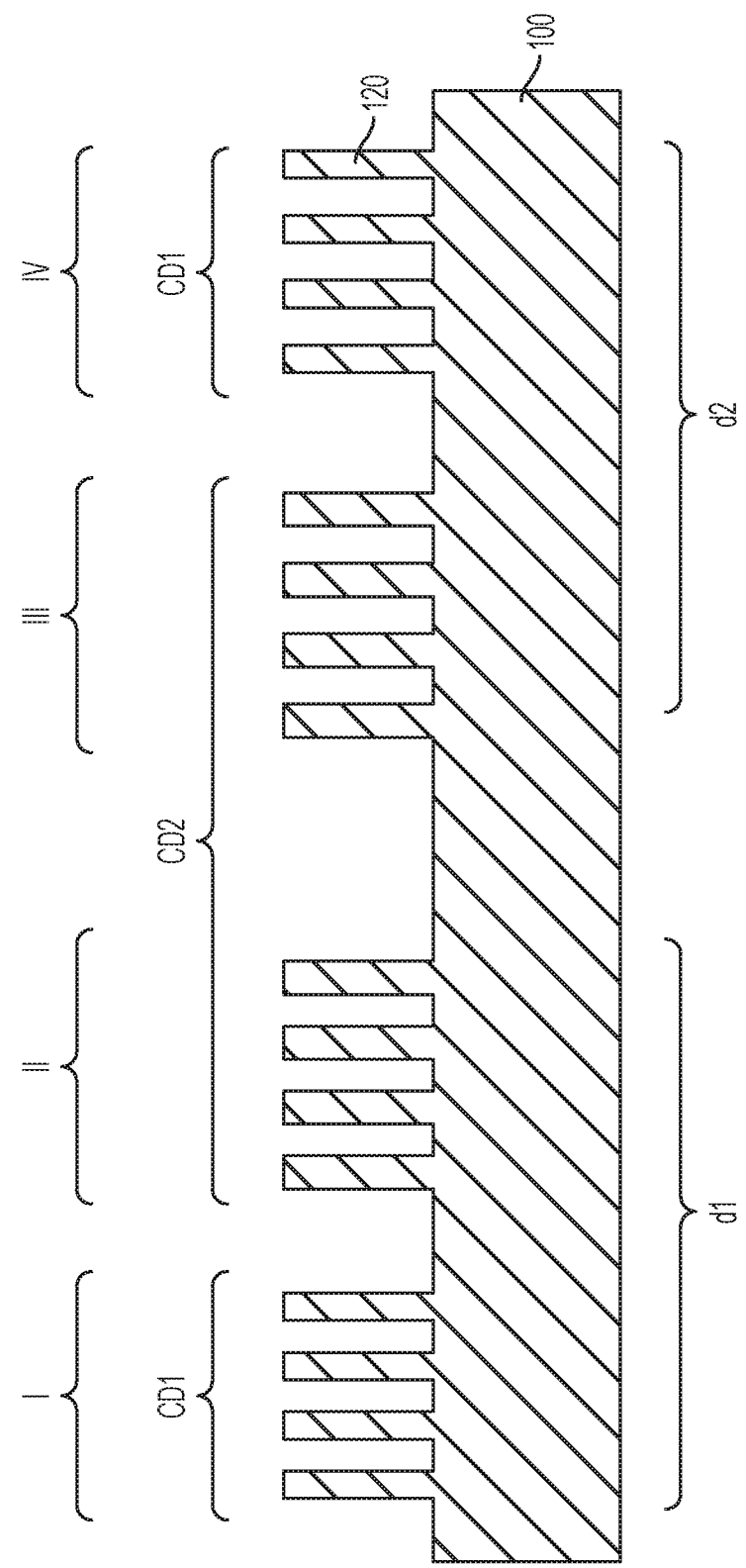
FIG. 1 is a schematic cross-sectional diagram showing arrays of semiconductor fins on a semiconductor substrate formed with a distinct critical dimension (CD) and intra-fin spacing (d) within different regions of the substrate.

Reference will now be made in greater detail to various embodiments of the subject matter of the present application, some embodiments of which are illustrated in the accompanying drawings. The same reference numerals will be used throughout the drawings to refer to the same or similar parts.

Disclosed are semiconductor structures and their methods of manufacture and, more particularly, a masking process that incorporates a curable silicon nitride material into a patterning architecture for forming semiconductor fin arrays having a controlled and variable fin critical dimension (CD) and fin pitch (d) within a given array.

With reference to FIG. 1, a semiconductor structure at an intermediate stage of fabrication includes a semiconductor substrate 100 having a plurality of semiconductor fins 120 formed thereon. Within a first region (I) of the substrate, fins 120 are characterized by a first critical dimension (CD1) and are configured in an array having a first intra-fin spacing, or pitch, d1. Within a second region (11) of the substrate, fins 120 are characterized by a second critical dimension (CD2) that is greater than the first critical dimension (CD1), and are configured in an array having the first pitch (d1). Within a third region (III) of the substrate, fins 120 have the second critical dimension (CD2) and are configured in an array having a second intra-fin spacing, or pitch (d2) that is greater than the first intra-fin spacing (d1). Within a fourth region (IV) of the substrate, fins 120 are configured in an array having the second pitch (d2) and the first critical dimension (CD1).

Although the illustrated embodiment depicts four arrays, each comprising four fins 120, the number of arrays and the number of fins per array may be selected for a particular function or application. For instance, first and second regions (I, II) may be adapted for logic functionality, while third and fourth regions (III, IV) may be adapted for first and second types of memory (e.g., an SRAM cell having one or more pull-up devices, one or more pull-down devices, and one or more pass gate devices). Thus, in various embodiments, the present method enables the formation of two or more distinct devices (e.g., logic and memory devices) on the same chip.

As used herein, the terms "critical dimension" or "width" may be used interchangeably to refer a lateral dimension of a structure or feature (e.g., the distance between opposing sidewalls of a fin or mandrel). Example fins have a critical dimension of 5 to 20 nm, e.g., 5, 10, 15 or 20 nm, including ranges between any of the foregoing values. An "array" of fins may include any integral number of fins, N, where N≥2.

The term "pitch" refers to the center-to-center distance between one structure or feature (e.g., a first fin or a first mandrel) and an adjacent structure or feature (e.g., a second fin or a second mandrel). Thus, pitch is equal to the sum of the width of a structure or feature and the spacing of that structure or feature to an adjacent structure or feature. According to various embodiments, the pitch (d1, d2, d3, d4) within any region (I, II, III, IV) of the substrate may be independently defined within a range of 20 to 100 nm, e.g., 20, 30, 40, 50, 60, 70, 80, 90 or 100 nm, including ranges between any of the foregoing values, although smaller and larger pitch values are contemplated. In exemplary embodiments, d1≤d2≤d3≤d4. In further exemplary embodiments, d1≤d3≤d2≤d4 or d1≤d3≤d4≤d2. In still further embodiments, d1≤d4≤d2≤d3 or d1≤d4≤d3≤d2.

Referring still to FIG. 1, substrate 100 may include a semiconductor material such as silicon, e.g., single crystal Si or polycrystalline Si, or a silicon-containing material. Silicon-containing materials include, but are not limited to, single crystal silicon germanium (SiGe), polycrystalline silicon germanium, silicon doped with carbon (Si:C), amorphous Si, as well as combinations and multi-layers thereof. As used herein, the term "single crystal" denotes a crystalline solid, in which the crystal lattice of the entire solid is substantially continuous and substantially unbroken to the edges of the solid with substantially no grain boundaries.

The substrate 100 is not limited to silicon-containing materials, however, as the substrate 100 may comprise other semiconductor materials, including Ge and compound semiconductors, including Ill-V compound semiconductors such as GaAs, InAs, GaN, GaP, InSb, ZnSe, and ZnS, and II-VI compound semiconductors such as CdSe, CdS, CdTe, ZnSe, ZnS and ZnTe.

Substrate 100 may be a bulk substrate or a composite substrate such as a semiconductor-on-insulator (SOI) substrate that comprises, from bottom to top, a handle portion, an isolation layer, and a semiconductor material layer.

Substrate 100 may have dimensions as typically used in the art and may comprise, for example, a semiconductor wafer. Example wafer diameters include, but are not limited to, 50, 100, 150, 200, 300 and 450 mm. The total substrate thickness may range from 250 microns to 1500 microns, although in particular embodiments the substrate thickness is in the range of 725 to 775 microns, which corresponds to thickness dimensions commonly used in silicon CMOS processing. The semiconductor substrate 100 may comprise (100)-oriented silicon or (111)-oriented silicon, for example.

In various embodiments, fins 120 comprise a semiconductor material such as silicon, and may be formed by patterning and then etching the semiconductor substrate 100, i.e., a top portion of the semiconductor substrate. In several embodiments, the fins 120 are etched from, and therefore contiguous with the semiconductor substrate 100.

Reference will now be made to FIGS. 2-25, which together with the following description, provide exemplary methods for manufacturing plural fins (e.g., plural fin arrays) within different regions of a semiconductor substrate 100 where the fin critical dimension (CD) and the fin pitch (d) are locally and independently controlled within each region as depicted, for example, in FIG. 1. In certain embodiments, with particular reference to FIGS. 2-14, a blanket layer of curable silicon nitride is patterned to form a plurality of etch mask structures that are selectively cured to locally alter the etch mask structure-to-etch mask structure spacing in different regions of the substrate. A later-deposited layer of conformal silicon nitride is used to define sidewall spacers that are selectively cured to locally tune their critical dimension and provide patterned masking layers having at least one variable cross sectional dimension (e.g., width) within different regions of the substrate.

In further embodiments, with particular reference to FIGS. 15-25, first and second conformal layers of curable silicon nitride are used at various stages of a fin patterning process flow. The first conformal layer of curable silicon nitride is used to define sidewall spacers that are selectively cured to locally alter the lateral dimension(s) thereof. The patterned silicon nitride structures are used as etch masks to define mandrels having a controlled pitch and critical dimension within different regions of the substrate. The second conformal layer of curable silicon nitride is also used to define sidewall spacers that are selectively cured to locally alter a lateral dimension(s) thereof. In connection with specific embodiments, the thus patterned silicon nitride structures are used as etch masks to directly define fins having a controlled pitch and critical dimension within different regions of the substrate.

Referring to FIG. 2, disposed over semiconductor substrate 100 is a patterning architecture 190 according to certain embodiments comprising plural layers that may be formed one over the other in succession. In the illustrated embodiment, patterning architecture 190 comprises, from bottom to top, pad oxide layer 200, nitride layer 300, medium temperature oxide (MTO) or low temperature oxide (LTO) layer 400, silicon layer 500, UV-curable silicon nitride layer 600, and top mandrel layer 700.

According to various embodiments, the formation or deposition of a layer or structure, including the foregoing layers, may involve one or more techniques suitable for the material or layer being deposited or the structure being formed. Such techniques include, but are not limited to, chemical vapor deposition (CVD), low-pressure chemical vapor deposition (LPCVD), plasma enhanced chemical vapor deposition (PECVD), microwave plasma chemical vapor deposition (MPCVD), metal organic CVD (MOCVD), atomic layer deposition (ALD), molecular beam epitaxy (MBE), electroplating, electroless plating, ion beam deposition, spin-on coating, thermal oxidation, and physical vapor deposition (PVD) techniques such as sputtering or evaporation.

Referring still to FIG. 2, a pad oxide layer 200 is formed directly over semiconductor substrate 100. By way of example, pad oxide 200 may comprise silicon dioxide. Pad oxide 200 may be plasma-deposited or thermally grown from a precursor suite comprising a silicon source such as tetraethylorthosilicate (TEOS) and an oxygen source such as oxygen gas or ozone. Pad oxide 200 may be spun-on using TEOS as a precursor. A thickness of pad oxide 200 may range from 3 to 10 nm, e.g., 3, 5 or 10 nm, including ranges between any of the foregoing values, although greater and lesser thicknesses are contemplated. Pad oxide 200 may serve as a buffer layer between the semiconductor substrate 100 and overlying hard mask 300.

In the illustrated embodiment, a hard mask 300, such as a nitride hard mask, directly overlies the pad oxide layer 200. An example hard mask 300 comprises silicon nitride, and may have a thickness of 20 to 50 nm, e.g., 20, 25, 30, 35, 40, 45 or 50 nm, including ranges between any of the foregoing values. The hard mask 300 is adapted to serve as an etch stop layer during subsequent processing. As used herein, a "hard mask" comprises an inorganic material.

A medium temperature oxide (MTO) layer or low temperature oxide (LTO) layer 400 is formed over the hard mask 300. A medium temperature oxide layer 400 may be formed by chemical vapor deposition (CVD) at a temperature of 300°-500° C. using a silicon-containing precursor such as $SiH_4$, and an oxidizing gas such as $O_2$ or $N_2O$. A low temperature oxide may be deposited at a temperature of less than 300° C. In various embodiments, the MTO or LTO has a thickness of 10 to 50 nm, e.g., 10, 20, 30, 40 or 50 nm, including ranges between any of the foregoing values, and may be patterned to form a mandrel layer during subsequent processing.

A layer of silicon 500 is formed over the MTO (or LTO) layer 400. A silicon thin film can be deposited using silane, disilane, silicon tetrachloride, silicon trichloride, silicon dichloride, and the like as a silicon precursor, generally together with a carrier gas such as nitrogen or hydrogen. Amorphous elemental silicon can be deposited using chemical vapor deposition, such as low pressure chemical vapor deposition (LPCVD) at temperatures ranging from 450° C. to 70° C. In certain embodiments, the silicon layer 500 has a thickness of 10 to 80 nm and may function as an etch stop layer.

A curable silicon nitride layer 600 is formed over silicon layer 500. The curable silicon nitride (SiN or $Si_3N_4$) layer may be deposited by plasma enhanced chemical vapor deposition (PECVD), although silicon nitride may be deposited by other thermal CVD processes, including low pressure CVD (LPCVD), atmospheric pressure CVD (APCVD), or by other suitable techniques such as spin-coating, or dip-coating.

An example PECVD process uses silane ($SiH_4$) and ammonia ($NH_3$) as source gases, together with one or more carrier gases such as nitrogen, argon or helium, at a chamber pressure of 5 to 20 Torr, substrate temperature of 200 to 500° C., and applied (RF) power of 300 to 1200 W.

As will be appreciated by those skilled in the art, as-deposited nitride layers, including PECVD thin films, typically contain a considerable amount of hydrogen. PECVD silicon nitride films, for example, generally contain 15-30% hydrogen in the form of Si—H and N—H bonds. Without wishing to be bound by theory, irreversible tensile stress may develop in such PECVD films by removing hydrogen.

The loss of hydrogen and the concomitant shrinkage of micro-voids cause a volume reduction of the nitride layer. Lateral shrinkage may be partially constrained by underlying (or overlying) layers, which can impose a tensile strain in the layer. In certain embodiments, thermal annealing at temperatures in excess of 500° C. may be used to remove hydrogen from the curable silicon nitride layer 600. In further embodiments, UV irradiation may be used to cure the silicon nitride layer, e.g., after patterning thereof, which can alter the dimensions of the pre-patterned layer.

For instance, photons from a UV source such as a mercury lamp having a wavelength of 150 nm to 800 nm and a radiant flux of 0.5 µW/cm$^2$ to 15 W/cm$^2$ may provide sufficient energy to cleave H-bonds, e.g., Si—H and N—H bonds. In certain embodiments, the UV irradiation has a penetration depth effective to cure a layer of full thickness, for example, between 5 and 40 nm, e.g., 5, 10, 15, 20, 25, 30, 35 or 40 nm, including ranges between any of the foregoing values. A purge gas such as He, Ar or $N_2$ may be used during UV curing to remove evolved hydrogen.

The process pressure during curing may range from $10^{-3}$ to 1000 Torr. At a substrate temperature of 25 to 500° C., hydrogen atoms combine to form $H_2$, which diffuses out of the nitride layer. The removal of hydrogen creates microvoids. The driving force to minimize the surface energy thereof, together with photon energy from the UV source and thermal energy due to substrate heating causes the voids to shrink. Thermal or UV curing may therefore induce a lateral shrinkage in a patterned layer of curable silicon nitride of 1 to 20%, e.g., 1, 2, 5, 10, 15 or 20%, including ranges between any of the foregoing values. As used herein, a "curable" material or layer refers to a material or layer that is not fully cured.

A top mandrel layer 700, such as a layer of amorphous carbon (a-C), is formed over the silicon nitride layer 600 and is adapted to be patterned and provide a sacrificial mandrel for the fin patterning process described herein. An amorphous carbon layer may be formed from a gas mixture comprising a hydrocarbon source and a diluent gas at a deposition temperature of 200° C. to 700° C., for example.

Exemplary hydrocarbon compounds that may be included in the hydrocarbon source used to form the top mandrel layer 700 may be described by the formula $C_xH_y$, where $1 \leq x \leq 10$ and $2 \leq y \leq 30$. Such hydrocarbon compounds may include, but are not limited to alkanes such as methane, ethane, propane, butane and its isomer isobutane, pentane and its isomers isopentane and neopentane, hexane and its isomers 2-methylpentane, 3-methylpentane, 2,3-dimethylbutane, 2,2-dimethyl butane, and the like; alkenes such as ethylene, propylene, butylene and its isomers, pentene and its isomers, and the like; dienes such as butadiene, isoprene, pentadiene, hexadiene and the like, and halogenated alkenes include monofluoroethylene, difluoroethylenes, trifluoroethylene, tetrafluoroethylene, monochloroethylene, dichloroethylenes, trichloroethylene, tetrachloroethylene, and the like; and alkynes such as acetylene, propyne, butyne, vinylacetylene and derivatives thereof. Further hydrocarbon compounds include aromatic molecules such as benzene, styrene, toluene, xylene, ethylbenzene, acetophenone, methyl benzoate, phenyl acetate, phenol, cresol, furan, and the like, as well as halogenated aromatic compounds including monofluorobenzene, difluorobenzenes, tetrafluorobenzenes, hexafluorobenzenes and the like.

Suitable diluent gases may include, but are not limited to, hydrogen ($H_2$), helium (He), argon (Ar), ammonia ($NH_3$), carbon monoxide (CO), carbon dioxide ($CO_2$), and mixtures thereof.

The top mandrel layer 700 may have a thickness of 50 to 150 nm, e.g., 50, 75, 100, 125 or 150 nm, including ranges between any of the foregoing values, although greater and lesser thicknesses may be used. Optionally, an as-deposited amorphous carbon (a-C) layer may be cured such as by exposure to UV radiation at a curing temperature greater than 200° C. In various embodiments, the amorphous carbon layer comprises a soft etching mask. As used herein, a "soft mask" comprises polymeric or other organic materials.

As will be appreciated, in specific embodiments, one or more layers within the patterning architecture 190, including the top mandrel layer 700, may be conventionally patterned during various stages of the presently-disclosed method to form mandrels. After patterning, sidewall spacers are formed on opposing sides of the mandrels. The mandrels can then be removed, leaving the pair of sidewall spacers. The sidewalls spacers, in turn, can be used to pattern an underlying layer.

Referring to FIG. 3, etching of the top mandrel layer 700 to form mandrels 720, 730 may be achieved using any conventional lithography and etching process, which typically includes forming a layer of photoresist (not shown) over the top mandrel layer 700. The photoresist (not shown) may include a positive-tone photoresist composition, a negative-tone photoresist composition, or a hybrid-tone photoresist composition. The layer of photoresist material may be formed by a deposition process such as, for example, spin-on coating.

According to various embodiments, the deposited photoresist layer is subjected to a pattern of irradiation, and the exposed photoresist material is developed utilizing a conventional resist developer. In the instant embodiment, this provides a patterned layer of photoresist within various regions (I-IV) of the substrate. The pattern provided by the patterned photoresist material is thereafter transferred into the top mandrel layer 700, and the photoresist is removed. FIG. 3 shows the patterning of the top mandrel layer 700 to define a first set of mandrels 720 within first and second device regions of the substrate and a second set of mandrels 730 within third and fourth device regions of the substrate.

The pattern transfer etching process is typically an anisotropic etch. In certain embodiments, a dry etching process such as, for example, reactive ion etching can be used. In other embodiments, a wet chemical etchant can be used. In still further embodiments, a combination of dry etching and wet etching can be used. The curable silicon nitride layer 600 may serve as an etch stop layer during patterning of the top mandrel layer 700.

For simplicity of illustration, only a single mandrel is shown within each device region (I, II, III, IV) of the substrate, although various embodiments contemplate plural mandrels within each region. By way of example, mandrels 720 within the first and second regions (I, II) may have a first width and a first intra mandrel spacing, while mandrels 730 within third and fourth regions (III, IV) may have a second width and a second intra mandrel spacing. The first mandrel width and the first intra mandrel spacing may be less than the second mandrel width and the second intra mandrel spacing, respectively.

By way of example, a mandrel 720, 730 may have a width of 20 to 50 nm, e.g., 20, 25, 30, 35, 40, 45 or 50 nm, including ranges between any of the foregoing values. Intra-region variability in the mandrel dimensions (e.g., width) may range from 10 to 50%, e.g., 10, 20, 30, 40 or 50%, including ranges between any of the foregoing values. For instance, and by way of example, a mandrel 720 within the second device region (II) may have a width (w2) of 20 nm and a mandrel within 730 the third device region (III) may have a width (w3) of 25 nm. In a further example, a mandrel 720 within the second device region (11) may have a width (w2) of 30 nm and a mandrel 730 within the third device region (III) may have a width (w3) of 33 nm.

In a similar vein, the mandrel-to-mandrel spacing may range from 20 to 50 nm, e.g., 20, 25, 30, 35, 40, 45 or 50 nm, including ranges between any of the foregoing values, and the intra-region variability in mandrel spacing may range from 10 to 50%. For instance, mandrels located within the first device region (I) and/or the second device region (II) may have a mandrel-to-mandrel spacing of 20 nm, while mandrels located within the third device region (III) and/or the fourth device region (IV) may have a mandrel-to-mandrel spacing of 25 nm.

Referring to FIG. 4, a spacer layer 800 is formed over the top mandrels 720, 730. In various embodiments, formation of the spacer layer 800 includes a conformal deposition process such as a chemical vapor deposition (CVD) process. The thickness of the spacer layer 800 may range from 5 to 20 nm, e.g., 5, 10, 15 or 20 nm, including ranges between any of the foregoing values. The spacer layer 800 may comprise, for example, silicon dioxide ($SiO_2$). Alternatively, the spacer layer 800 may comprise other dielectric materials such as silicon nitride, curable silicon nitride, silicon oxynitride, a low-k material, or any suitable combination of these materials.

Exemplary low-k materials include but are not limited to, amorphous carbon, fluorine-doped oxides, carbon-doped oxides, SiCOH or SiBCN. Commercially-available low-k dielectric products and materials include Dow Corning's SiLK™ and porous SiLK™, Applied Materials' Black Diamond™, Texas Instrument's Coral™ and TSMC's Black Diamond™ and Coral™. As used herein, a low-k material has a dielectric constant less than that of silicon dioxide.

Formation of the spacer layer 800 is followed by an anisotropic etch, such as a reactive ion etch, to remove the spacer material from horizontal surfaces, which exposes top surfaces of the mandrels 720, 730 and a top surface of the UV-curable silicon nitride layer 600 between the mandrels, as illustrated in FIG. 5. After the anisotropic etch, a thin structure of the spacer layer 800 remains on the sidewalls of each of the mandrels 720, 730.

Referring to FIG. 6, the mandrels 720, 730 are then removed with selectivity to the spacer layer material and the curable silicon nitride layer 600 to define a top etch mask 820 comprising remaining portions of the top spacer layer. Removal of the mandrel material (e.g., amorphous carbon) can be achieved, for example, using conventional etch methods such as an isotropic wet etch process. The top etch mask 820 will be used to pattern the curable silicon nitride layer 600.

The top etch mask 820 may include structures having a width of 5 to 20, e.g., 5, 10, 15 or 20 nm, arranged at a pitch of 25 to 70 nm, e.g., 25, 30, 40, 50, 60 or 70 nm, including ranges between any of the respective foregoing values. At this stage of manufacture, patterned structures of the top etch mask 820 may have a constant width across the various device regions (I, II, III, IV), but may be arranged at a variable pitch due to the variability in the dimensions of the mandrels 720, 730.

Referring to FIG. 7, a further etching step is used to etch the curable silicon nitride layer 600 and transfer the overlying pattern of the top etch mask 820 into the curable silicon nitride layer 600 to form a middle etch mask 620. Silicon layer 500 may function as an etch stop layer during etching of the curable silicon nitride layer 600.

Figure 8:
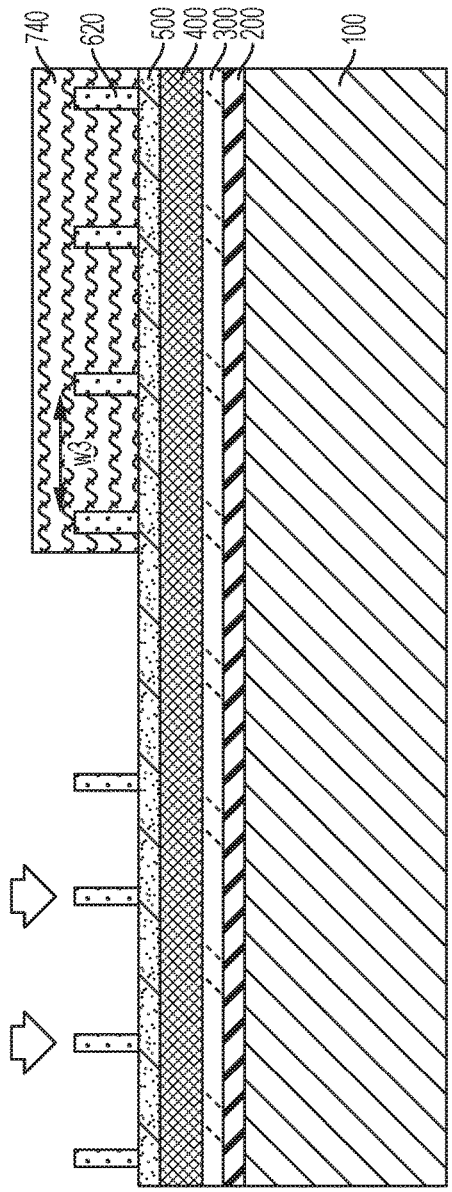
FIG. 8 depicts the formation of a block mask over the patterned silicon nitride layer within third and fourth regions of the substrate and curing of the patterned silicon nitride layer within first and second regions of the substrate.

Referring to FIG. 8, block mask 740 is formed over the structure and patterned using conventional lithography. As shown, block mask 740 covers the middle etch mask 620 within third and fourth regions (III, IV) of the substrate. The processes and materials used to form the block mask 740 may be the same as those used to form the top mandrel layer 700 described above. The block mask 740 is adapted to protect portions of middle etch mask 620 from exposure to UV radiation.

Unprotected portions of the middle etch layer 620 may be cured by exposure to UV radiation. An ultraviolet radiation source can emit a single ultraviolet wavelength or a broadband of ultraviolet wavelengths. A suitable single wavelength ultraviolet source comprises an excimer ultraviolet source that provides a single ultraviolet wavelength of 172 nm or 222 nm. A suitable broadband source generates ultraviolet radiation having wavelengths of from about 200 to about 400 nm. Different UV treatment times and temperatures may be used. According to various embodiments, during UV exposure, the substrate temperature can be maintained at 25-400° C., and the dose period may range from 1 to 30 min.

Figure 9:
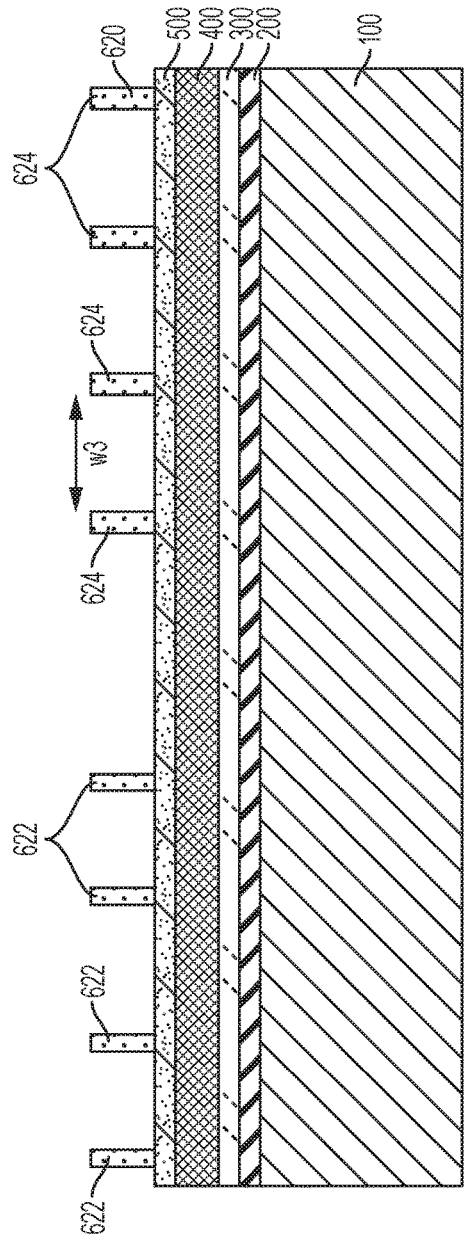
FIG. 9 shows the architecture of FIG. 8 following removal of the block mask.

Exposure to UV radiation causes a restructuring of exposed portions of the middle etch mask 620, i.e., the liberation of hydrogen and the shrinkage of micropores, which causes a lateral shrinkage of the exposed middle etch mask 620 of 5 to 20% to form cured middle etch mask structures 622 within device regions I and II. Referring to FIG. 9, following removal of the block mask 740, the architecture includes cured middle etch mask structures 622 within device regions I and II, and uncured middle etch mask structures 624 within device regions III and IV, which are unmodified by the UV exposure. A width of the cured structures 622 may be 5 to 20% less than a width of the uncured structures 624.

Figure 10:
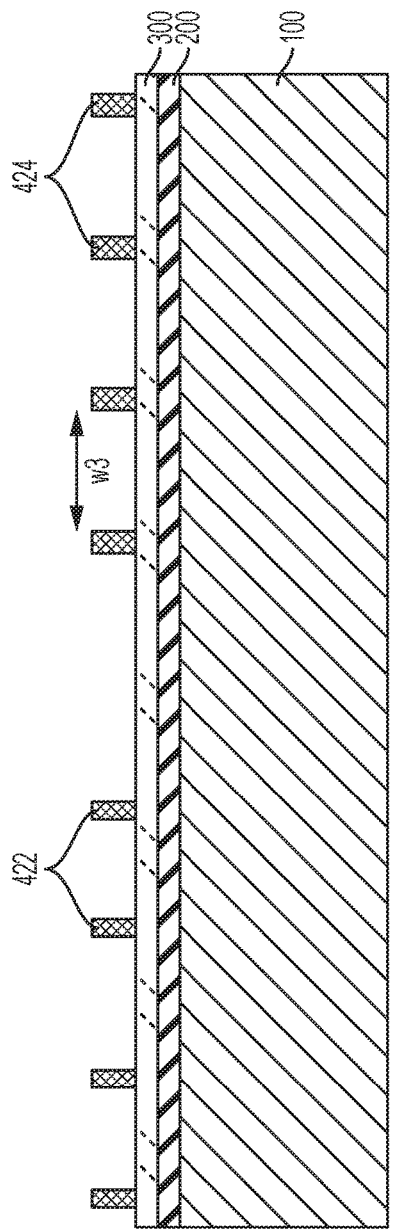
FIG. 10 shows an etching step and the pattern transfer of the cured and uncured silicon nitride layers into an oxide layer.

Referring to FIG. 10, using the cured and uncured structures 622, 624 as an etch mask, a further etching step, such as a reactive ion etching step, is used to etch through the MTO or LTO layer 400 and transfer the overlying pattern into the MTO or LTO layer 400 to form a plurality of bottom mandrels 422, 424. The patterning of the MTO (or LTO) material can be achieved using any conventional lithography and etching (reactive ion etching) processes, known to accomplish such patterning techniques. Within device regions I and II, bottom mandrels 422 have a first width and a first pitch, while within device regions III and IV, bottom mandrels 424 have a second width and a second pitch.

Figure 11:
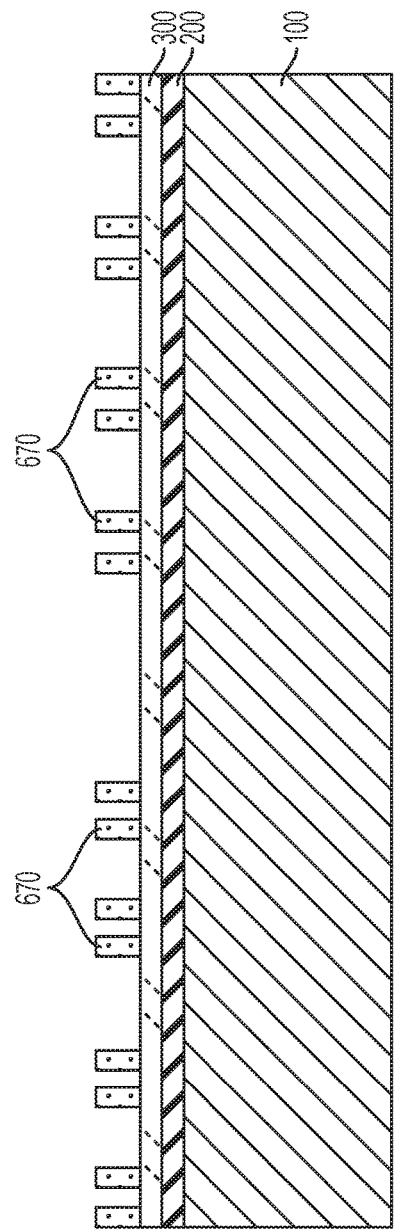
FIG. 11 shows the deposition of a conformal curable silicon nitride layer over the patterned oxide layer following the anisotropic etch back of the curable silicon nitride layer.

FIG. 11 shows the device architecture following the deposition of a conformal curable silicon nitride layer over the bottom mandrels 422, 424 following an anisotropic etch back of the curable silicon nitride layer to form a bottom etch mask 670. As this stage of manufacture, the pitch associated with the bottom etch mask structures in device regions I and II is less than the pitch associated with the bottom etch mask structures in device regions II and IV.

Referring to FIG. 12, a masking layer is formed over the structure and patterned using conventional lithography to form a further block mask 740 that covers bottom etch mask 670 within second and third device regions (II, Ill) of the substrate. The processes and materials used to form the block mask 740 may be the same as those used to form the top mandrel layer 700 described above. The further block mask 740 shown in FIGS. 12 and 13 is adapted to protect portions of bottom etch mask 670 from exposure to UV radiation.

Figure 14:
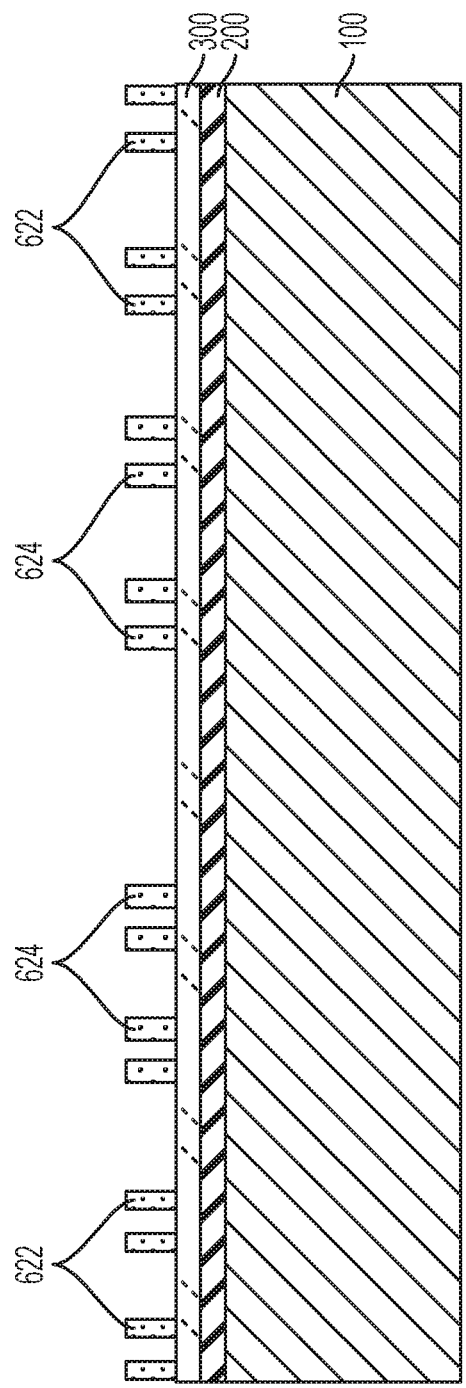
FIG. 14 shows the architecture of FIG. 13 following removal of the block mask.

Bottom etch mask structures are then cured by exposure to UV radiation, which causes a restructuring of exposed portions of the bottom etch mask 670, and a lateral shrinkage thereof to form cured bottom etch mask structures 622 within device regions I and IV. Referring to FIG. 14, following removal of the block mask 740, a width of the cured structures 622 within device regions I and IV is 5 to 20% less than a width of the uncured structures 624 within device regions II and III. Referring back to the structure of FIG. 1, the cured and uncured structures can, in turn, be used as etch masks to simultaneously pattern fins 120 within first, second, third and fourth regions of the substrate.

According to various embodiments, the fins 120 are defined using plural patterning and etching processes employing cured and uncured layers of patterned silicon nitride. In the foregoing embodiments, a blanket layer of curable silicon nitride is patterned to form a plurality of etch mask structures that are cured within select device regions to locally alter the spacing between etch mask structures. A later-deposited layer of conformal silicon nitride is used to define sidewall spacers that are selectively cured to locally tune the width (i.e., CD) of the sidewall spacers and provide patterned masking layers having at locally-defined width within different regions of the substrate.

In the following embodiments, which are described with reference to FIGS. 15-25, first and second conformal layers of curable silicon nitride are used at different stages of a fin patterning process flow. The first conformal layer of curable silicon nitride is used to define sidewall spacers that are selectively cured to locally alter the lateral dimension(s) thereof. The patterned silicon nitride structures are used as etch masks to define mandrels having a controlled pitch and critical dimension within different regions of the substrate. The second conformal layer of curable silicon nitride is also used to define sidewall spacers that are selectively cured to locally alter a lateral dimension(s) thereof. In connection with specific embodiments, the thus patterned silicon nitride structures are used as etch masks to directly define fins having a controlled pitch and critical dimension within different regions of the substrate.

Figure 15:
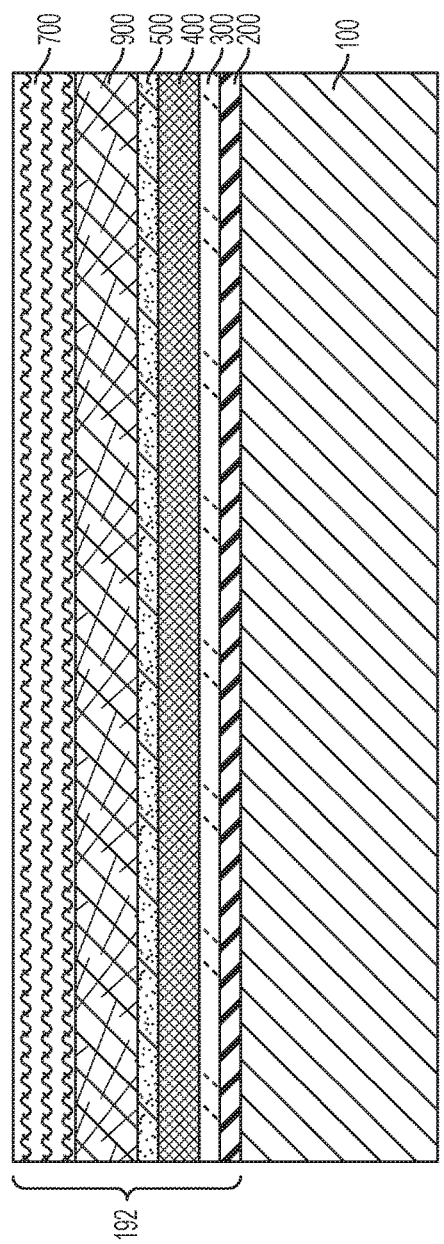
FIG. 15 is a cross-sectional schematic diagram showing a further patterning architecture disposed over a semiconductor substrate according to further embodiments.

Referring to FIG. 15, a patterning architecture 192 is formed over a semiconductor substrate 100. Patterning architecture 192 may include the same structures and materials and may be formed by the same methods used for patterning architecture 190, except the curable silicon nitride layer 600 is replaced by an oxide layer 900. Oxide layer 900 may comprise CVD silicon dioxide, for example, and may have a thickness of 10 to 50 nm.

Figure 16:
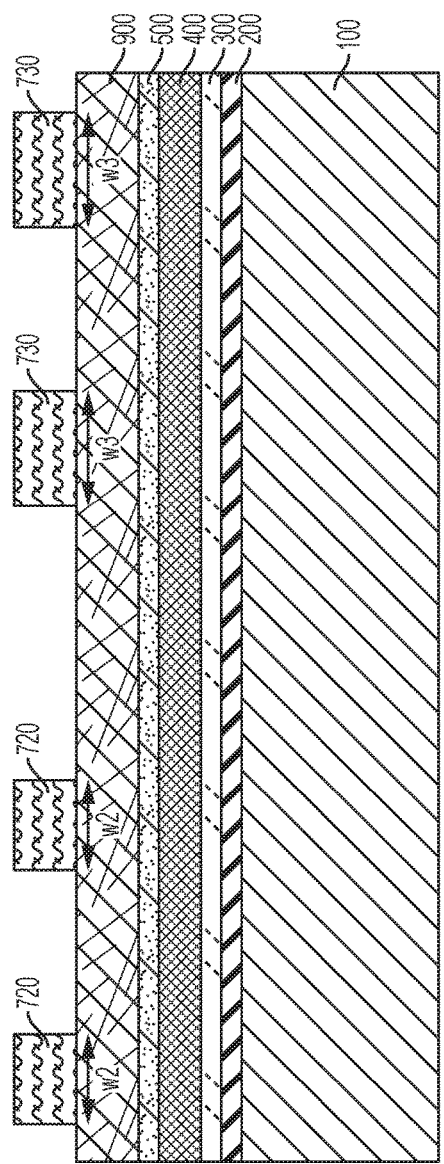
FIG. 16 shows patterning of an amorphous carbon layer to define a first set of mandrels within first and second device regions of the substrate and a second set of mandrels within third and fourth device regions of the substrate.

Top mandrel layer 700 is patterned using conventional lithography and etching techniques to define a first set of mandrels 720 within first and second device regions (I, II) of the substrate 100, and a second set of mandrels 730 within third and fourth device regions (Ill, IV) of the substrate 100. In the instant embodiment, as seen in FIG. 16, the top mandrels 720, 730 are formed directly over oxide layer 900. The oxide layer 900 may serve as an etch stop layer during patterning of the top mandrel layer 700.

Figure 17:
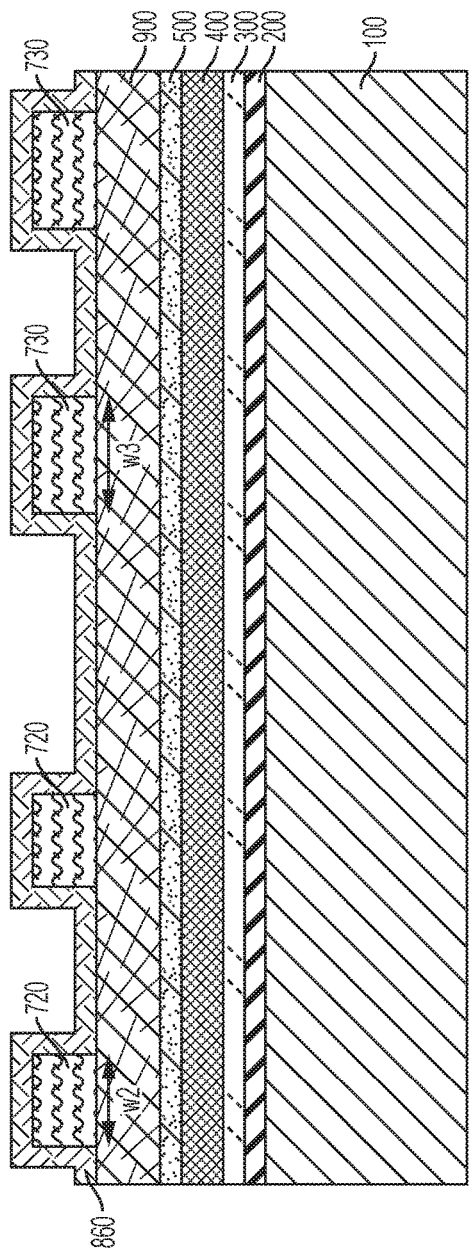
FIG. 17 shows the deposition of a conformal spacer layer of curable silicon nitride over the first and second sets of mandrels.

FIG. 17 shows the conformal deposition of a spacer layer 860 over the top set of mandrels 720, 730. In various embodiments, spacer layer 860 comprises a conformal layer of curable silicon nitride. The thickness of the spacer layer 860 may range from 5 to 20 nm, e.g., 5, 10, 15 or 20 nm, including ranges between any of the foregoing values.

Figure 18:
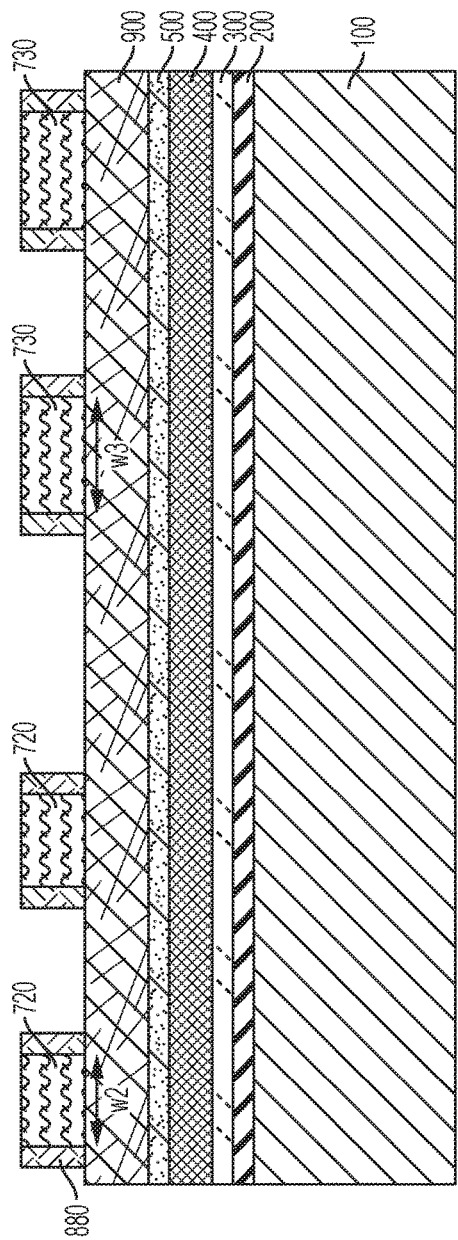
FIG. 18 depicts the anisotropic etch back of the curable silicon nitride spacer layer.

Referring to FIG. 18, formation of the spacer layer 860 is followed by an anisotropic etch to remove the spacer layer from horizontal surfaces. The etch back of the spacer layer 860 exposes top surfaces of the mandrels 720, 730 and the top surface of oxide layer 900, which may function as an etch stop layer during the etch back. After the anisotropic etch, a thin structure of the spacer layer remains on the sidewal Is of each of the mandrels. In the illustrated embodiment, the thin structures of the curable silicon nitride spacer layer that remain on the sidewalls of the mandrels form a top etch mask 880 in each of regions I, 11, III and IV.

The top etch mask 880 may include structures having a width of 5 to 20 nm, e.g., 5, 10, 15 or 20 nm, arranged at a pitch of 25 to 70 nm, e.g., 25, 30, 40, 50, 60 or 70 nm, including ranges between any of the respective foregoing values. At this stage of manufacture, patterned structures of the top etch mask 880 may have a constant width across the various device regions (I, II, III, IV), but may be arranged at a variable pitch due to the variability in the dimensions of the mandrels 720, 730.

Referring to FIG. 19, a masking layer is formed over the structure and patterned using conventional lithography to form a block mask 750 that covers mandrels 730 and top etch mask 880 spacers within third and fourth device regions (III, IV) of the substrate. The block mask 750 may comprise amorphous carbon, where the processes and materials used to form such a block mask 750 may be the same as those used to form the top mandrel layer 700 described above. Alternatively, block mask 750 may comprise amorphous silicon. The block mask 750 shown in FIG. 19 is adapted to protect top etch mask 880 from exposure to UV radiation.

Exposed portions of top etch mask 880 are then cured by exposure to UV radiation, which causes a restructuring and an accompanying lateral shrinkage to form cured top etch mask structures 882 within device regions I and II. Uncured top etch mask structures 884 are disposed within device regions III and IV. In the illustrated embodiment, the top etch mask 880 is cured prior to removing top mandrels 720. In alternative embodiments, the top etch mask 880 may be cured after removing top mandrels 720.

Referring to FIG. 20, following removal of the block mask 750, the architecture includes cured top etch mask structures 882 within device regions I and II, and uncured top etch mask structures 884 within device regions III and IV. In accordance with various embodiments, a width of the cured structures 882 may be 5 to 20% less than a width of the uncured structures 884.

Referring to FIGS. 21 and 22, successive etching steps are used to transfer the pattern of the cured and uncured silicon nitride etch mask structures 882, 884 into oxide layer 900 (and etch stop layer 500) to form an intermediate masking layer 922. The pattern of the intermediate masking layer 922 is then transferred into MTO layer 400 to form bottom mandrels 422, 424.

FIG. 23 shows the device architecture following the deposition of a conformal curable silicon nitride layer over the bottom mandrels 422, 424 following an anisotropic etch back of the curable silicon nitride layer to expose top surfaces of the mandrels 422, 424 and form etch mask structures 890. The thickness of the spacer layer may range from 5 to 20 nm, e.g., 5, 10, 15 or 20 nm, including ranges between any of the foregoing values.

Figure 25:
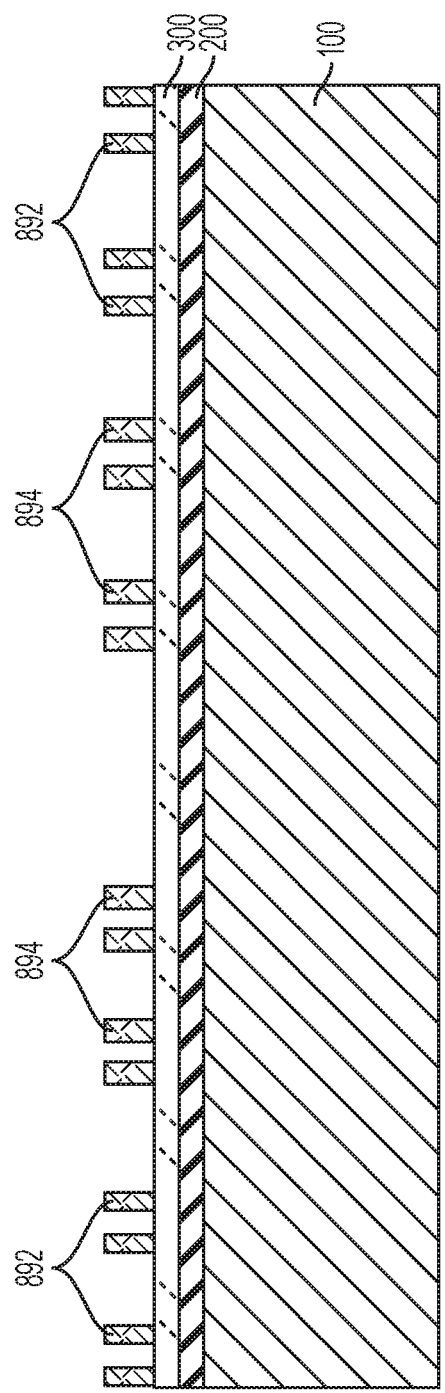
FIG. 25 shows the architecture of FIG. 24 following removal of the block mask and the oxide mandrels.

Referring to FIG. 24, a block mask is formed over the patterned silicon nitride layer within second and third regions (II, Ill) of the substrate and exposed portions of the etch mask structures 890 within the first and fourth regions (I, IV) are cured by exposure to UV radiation. Referring to FIG. 25, the block mask 740 and the oxide mandrels 422, 424 are removed to define a bottom etch mask comprising cured bottom etch mask 892 and uncured bottom etch mask 894, which can be used to form fins 120 within first, second, third and fourth regions of the substrate. The resulting structure is shown in FIG. 1.

In various embodiments, sidewall structures 342 within a first region (I) of the semiconductor substrate, such as a logic region, are arranged at a regular pitch d1. Sidewall structures 342 within a second region (II) of the semiconductor substrate, such as a first memory region, are arranged at a regular pitch d2.

After fin formation, a fin cut or fin removal process may be used to remove unwanted fins (e.g., dummy fins) or portions thereof from the particular circuit or device being fabricated. According to certain embodiments, a layer of photoresist is formed over the active and dummy fins and patterned using conventional lithography to form a block mask that covers the active fins within the first, second and third regions. The exposed dummy fins are removed using a suitable etching process. For instance, unwanted fins may be removed using a selective wet-etch, such as a KOH or TMAH-based anisotropic etch, or a selective dry etch. An example dry etch includes an $HBr/Cl_2/O_2$ chemistry in a microwave or remote plasma system.

FIG. 1 thus shows plural fin arrays formed over the semiconductor substrate, each array having a controlled and distinct combination of intra-fin spacing (d) and fin CD. In the illustrated example, active fins within a first region (I) of the substrate, such as a first logic region, are arranged at a first pitch d1, and have a first width (CD1), while active fins within a second region (II), such as a second logic region, are arranged at a first pitch d1, but have a second width (CD2). Active fins within a third region (III) of the substrate, such as a first memory region, are arranged at a second pitch d2, and have a first width (CD1), while active fins within a fourth region (IV), such as a second memory region, are arranged at a second pitch d2 but have a first width (CD1).

The methods and structures disclosed herein, which can include separate patterning of logic- and memory-dedicated fin arrays, may be used when manufacturing devices having any number of fins. The fin patterning, which can independently define the fin pitch and the fin CD, can be accomplished simultaneously. Furthermore, the disclosed methods may be used to co-integrate memory and logic devices on a single chip. Exemplary device architectures include vertical FinFET devices and vertical nanowire devices, although other platforms are contemplated. Additional processing steps may be performed to complete the device fabrication, such as forming gate electrodes, doping source and drain regions, creating electrical contacts, etc. Control of the fin pitch, for example, can facilitate partial merger or complete merger of epitaxial source/drain junctions between adjacent fins. Merged source/drain junctions, which can be more readily achieved closely spaced fins, may enhance device performance, while un-merged source/drain junctions may beneficially impact manufacturing yield and process uniformity.

The method as described herein may be used in the fabrication of integrated circuit (IC) chips. The integrated circuit chips may be distributed by the fabricator in raw wafer form (that is, as a single wafer that has multiple unpackaged chips), as a bare die, or in a packaged form. In the latter case, the chip is typically mounted in a single-chip package such as a plastic carrier, with leads that are affixed to a motherboard or other higher-level carrier, or in a multichip package such as a ceramic carrier. The chip can be integrated with other chips, discrete circuit elements, and/or other signal processing devices as part of an intermediate product such as a motherboard, or a consumer-facing product. The consumer-facing product can be any product that includes integrated circuit chips, ranging from toys and other low-end applications to handheld electronics such as telephones, to advanced computer products having a central processor, a display, a keyboard or other input/output (I/O) device.

As used herein, the singular forms "a," "an" and "the" include plural referents unless the context clearly dictates otherwise. Thus, for example, reference to a fin array having a "pitch" includes arrays having two or more "pitches" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a fin that comprises silicon include embodiments where the fin consists essentially of silicon and embodiments where the fin consists of silicon.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of forming a semiconductor structure, comprising:

forming a curable silicon nitride layer over a semiconductor substrate;

forming a top mandrel layer over the curable silicon nitride layer;

etching the top mandrel layer to form a first mandrel within the first region of the substrate and a second mandrel within the second region of the substrate;

forming spacer layers on sidewalls of the first and second mandrels;

patterning the curable silicon nitride layer by transferring a pattern corresponding to the spacer layers into the curable silicon nitride layer;

curing a portion of the patterned silicon nitride layer to form a first pattern over a first region of the substrate, wherein an uncured portion of the patterned silicon nitride layer defines a second pattern over a second region of the substrate;

transferring the first pattern into the substrate to form a first plurality of semiconductor fins within the first region; and transferring the second pattern into the substrate to form a second plurality of semiconductor fins within the second region.

2. The method of claim 1, wherein transferring the first pattern and transferring the second pattern are performed simultaneously.

3. The method of claim 1, wherein the fins within the first region of the substrate are arrayed at a first pitch and the fins within the second region of the substrate are arrayed at a second pitch different from the first pitch.

4. The method of claim 1, wherein the fins within the first region of the substrate have a first critical dimension and the fins within the second region of the substrate have a second critical dimension different from the first critical dimension.

5. The method of claim 1, wherein the fins within the first region of the substrate are arrayed at a first pitch and have a first critical dimension, the fins within the second region of the substrate are arrayed at a second pitch and have a second critical dimension, wherein the first pitch is different from the second pitch and the first critical dimension is different from the second critical dimension.

6. The method of claim 1, wherein the spacer layers comprise silicon dioxide.

7. The method of claim 1, wherein the spacer layers have a thickness of 5 to 20 nm.

8. The method of claim 1, wherein a width of the first pattern is 1 to 20% less than a width of the uncured portion of the patterned silicon nitride layer.

9. The method of claim 1, wherein the curing comprises exposing the curable silicon nitride layer to ultraviolet radiation.

10. A method of forming a semiconductor structure, comprising:
    forming a curable silicon nitride layer over a semiconductor substrate;
    forming a top mandrel layer over the curable silicon nitride layer;
    etching the top mandrel layer to form a first mandrel within a first region of the substrate and a second mandrel within a second region of the substrate;
    forming spacer layers on sidewalls of the first and second mandrels;
    transferring a pattern corresponding to the spacer layers into the curable silicon nitride layer; and
    curing a portion of the patterned silicon nitride layer to form a first pattern over the first region of the substrate, wherein an uncured portion of the patterned silicon nitride layer defines a second pattern over the second region of the substrate.

11. The method of claim 10, further comprising:
    transferring the first pattern into the substrate to form a first plurality of semiconductor fins within the first region; and
    transferring the second pattern into the substrate to form a second plurality of semiconductor fins within the second region.

12. The method of claim 11, wherein a width of the fins within the first region is 1 to 20% less than a width of the fins in the second region.

13. The method of claim 11, wherein the fins within the first region of the substrate are arrayed at a first pitch and have a first critical dimension, the fins within the second region of the substrate are arrayed at a second pitch and have a second critical dimension, the first pitch is different from the second pitch, and the first critical dimension is different from the second critical dimension.

14. The method of claim 10, wherein the curing comprises exposing the curable silicon nitride layer to ultraviolet radiation.

15. The method of claim 10, further comprising forming a block mask over the patterned silicon nitride layer within the second region of the substrate prior to the curing.

* * * * *